United States Patent
Halliyal et al.

(10) Patent No.: US 6,319,775 B1
(45) Date of Patent: Nov. 20, 2001

(54) NITRIDATION PROCESS FOR FABRICATING AN ONO FLOATING-GATE ELECTRODE IN A TWO-BIT EEPROM DEVICE

(75) Inventors: Arvind Halliyal, Sunnyvale; Robert B. Ogle, San Jose, both of CA (US); Susan G. Kim, Austin, TX (US); Kenneth Au, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/433,037

(22) Filed: Oct. 25, 1999

(51) Int. Cl.[7] ............................................... H01L 21/8247
(52) U.S. Cl. ........................................ 438/261; 438/763
(58) Field of Search .................................. 438/257–267, 438/763

(56) References Cited

U.S. PATENT DOCUMENTS

| | | | |
|---|---|---|---|
| 5,304,829 | * | 4/1994 | Mori et al. ............................ 257/324 |
| 5,371,028 | * | 12/1994 | Koh . |
| 5,496,753 | * | 3/1996 | Sakurai et al. . |
| 5,851,881 | * | 12/1998 | Lin et al. ............................... 438/261 |
| 5,888,870 | * | 3/1999 | Gardner et al. ........................ 438/261 |
| 5,966,603 | * | 10/1999 | Eitan ..................................... 438/258 |
| 6,063,666 | * | 5/2000 | Chang et al. .......................... 438/261 |
| 6,069,041 | * | 5/2000 | Tanigami et al. ..................... 438/261 |
| 6,074,917 | * | 6/2000 | Chang et al. .......................... 438/261 |

* cited by examiner

Primary Examiner—Richard Booth
(74) Attorney, Agent, or Firm—Amin & Turocy, LLP

(57) ABSTRACT

A process for fabricating an ONO floating-gate electrode in a two-bit EEPROM device includes the formation of a nitrogenated top oxide layer. The process includes the sequential formation of a silicon nitride layer and a top oxide layer using an in-situ LPCVD or RTCVD deposition process in which the silicon nitride layer is not exposed to ambient atmosphere prior to the formation of the top oxide layer. After forming the top oxide layer, an annealing process is carried out to diffuse nitrogen into the top oxide layer. The formation of a nitrogenated top oxide layer provides an improved two-bit EEPROM memory device by reducing charge leakage in the ONO floating-gate electrode.

14 Claims, 2 Drawing Sheets

NITRIDATION PROCESS FOR FABRICATING AN ONO FLOATING-GATE ELECTRODE IN A TWO-BIT EEPROM DEVICE

CROSS REFERENCE TO RELATED APPLICATIONS

Related subject matter is disclosed in the following co-pending and commonly assigned U.S. patent applications filed on an even date herewith, and are all herein incorporated by reference.

U.S. patent application Ser. No. 09/426,239, filed Oct. 25, 1999, now U.S. Pat. No. 6,218,227. "A METHOD TO GENERATE A MONOS TYPE FLASH CELL USING POLYCRYSTALLINE SILICON AS AN ONO TOP LAYER".

U.S. patent application Ser. No. 09/426,255, filed Oct. 25, 1999, now U.S. Pat. No. 6,207,502. "METHOD OF USING SOURCE/DRAIN NITRIDE FOR PERIPHERY FIELD OXIDE AND BIT-LINE OXIDE".

U.S. patent application Ser. No. 09/426,672, filed Oct. 25, 1999, now U.S. Pat. No. 6,265,268. "HIGH TEMPERATURE OXIDE DEPOSITION PROCESS FOR FABRICATING AN ONO FLOATING-GATE ELECTRODE IN A TWO-BIT EEPROM DEVICE".

U.S. patent application Ser. No. 09/426,240, filed Oct. 25, 1999, now U.S. Pat. No. 6,180,538. "PROCESS FOR FABRICATING AN ONO FLOATING-GATE ELECTRODE IN A TWO-BIT EEPROM DEVICE USING RAPID-THERMAL-CHEMICAL-VAPOR-DEPOSITION".

U.S. patent application Ser. No. 09/426,430, filed Oct. 25, 1999, now U.S. Pat. No. 6,248,628 "METHOD OF FABRICATING AN ONO DIELECTRIC BY NITRIDATION FOR MNOS MEMORY CELLS".

U.S. patent application Ser. No. 09/433,041, filed Oct. 25, 1999. "PROCESS FOR FABRICATING AN ONO STRUCTURE HAVING A SILICON-RICH SILICON NITRIDE LAYER,".

U.S. patent application Ser. No. 09/433,186, filed Oct. 25, 1999. "PROCESS FOR FABRICATING AN ONO STRUCTURE".

FIELD OF THE INVENTION

The present invention relates generally to non-volatile memory devices and to methods for their fabrication and, more particularly, to the fabrication of ONO layers in non-volatile memory devices.

BACKGROUND OF THE INVENTION

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, Flash EEPROM devices enable the erasing of all memory cells in the device using a single electrical current pulse.

Typically, an EEPROM device includes a floating-gate electrode upon which electrical charge is stored. The floating-gate electrode overlies a channel region residing between source and drain regions in a semiconductor substrate. The floating-gate electrode together with the source and drain regions forms an enhancement transistor. By storing electrical charge on the floating-gate electrode, the threshold voltage of the enhancement transistor is brought to a relatively high value. Correspondingly, when charge is removed from the floating-gate electrode, the threshold voltage of the enhancement transistor is brought to a relatively low value. The threshold level of the enhancement transistor determines the current flow through the transistor when the transistor is turned on by the application of appropriate voltages to the gate and drain. When the threshold voltage is high, no current will flow through the transistor, which is defined as a logic 0 state. Correspondingly, when the threshold voltage is low, current will flow through the transistor, which is defined as a logic 1 state.

In a flash EEPROM device, electrons are transferred to a floating-gate electrode through a dielectric layer overlying the channel region of the enhancement transistor. The electron transfer is initiated by either hot electron injection, or by Fowler-Nordheim tunneling. In either electron transfer mechanism, a voltage potential is applied to the floating-gate by an overlying control-gate electrode. The control-gate electrode is capacitively coupled to the floating-gate electrode, such that a voltage applied on the control-gate electrode is coupled to the floating-gate electrode. The flash EEPROM device is programmed by applying a high positive voltage to the control-gate electrode, and a lower positive voltage to the drain region, which transfers electrons from the channel region to the floating-gate electrode. The flash EEPROM device is erased by grounding the control-gate electrode and applying a high positive voltage through either the source or drain region of the enhancement transistor. Under erase voltage conditions, electrons are removed from the floating-gate electrode and transferred into either the source or drain regions in the semiconductor substrate.

Product development efforts in EEPROM device technology have focused on increasing the programming speed, lowering programming and reading voltages, increasing data retention time, reducing cell erasure times and reducing cell dimensions. Many of the foregoing research goals can be addressed through development of materials and processes for the fabrication of the floating-gate electrode. Recently, development efforts have focused on dielectric materials for fabrication of the floating-gate electrode. Silicon nitride in combination with silicon dioxide is known to provide satisfactory dielectric separation between the control-gate electrode and the channel region of the enhancement transistor, while possessing electrical characteristics sufficient to store electrical charge.

One important dielectric material for the fabrication of the floating-gate electrode is an oxide-nitride-oxide (ONO) structure. During programming, electrical charge is transferred from the substrate to the silicon nitride layer in the ONO structure. Voltages are applied to the gate and drain creating vertical and lateral electric fields, which accelerate the electrons along the length of the channel. As the electrons move along the channel, some of them gain sufficient energy to jump over the potential barrier of the bottom silicon dioxide layer and become trapped in the silicon nitride layer. Electrons are trapped near the drain region because the electric fields are the strongest near the drain. Reversing the potentials applied to the source and drain will cause electrons to travel along the channel in the opposite direction and be injected into the silicon nitride layer near the source region. Because silicon nitride is not electrically conductive, the charge introduced into the silicon nitride layer tends to remain localized. Accordingly, depending upon the application of voltage potentials, electrical charge can be stored in discrete regions within a single continuous silicon nitride layer.

Non-volatile memory designers have taken advantage of the localized nature of electron storage within a silicon nitride layer and have designed memory circuits that utilize two regions of stored charge within an ONO layer. This type of non-volatile memory device is known as a two-bit EEPROM. The two-bit EEPROM is capable of storing twice as much information as a conventional EEPROM in a memory array of equal size. A left and right bit is stored in physically different areas of the silicon nitride layer, near left and right regions of each memory cell. Programming methods are then used that enable two-bits to be programmed and read simultaneously. The two-bits of the memory cell can be individually erased by applying suitable erase voltages to the gate and to either the source or drain regions.

While the recent advances in EEPROM technology have enabled memory designers to double the memory capacity of EEPROM arrays using two-bit data storage, numerous challenges exist in the fabrication of material layers within these devices. In particular, the ONO layer must be carefully fabricated to avoid the creation of interface states that could provide charge leakage paths within the ONO layer. Accordingly, advances in ONO fabrication technology are necessary to insure proper charge isolation in ONO structures used in two-bit EEPROM devices.

SUMMARY OF THE INVENTION

The present invention is for a process for fabricating an ONO floating-gate electrode in a two-bit EEPROM device. Fabrication of a two-bit EEPROM device using an ONO floating-gate electrode requires the formation of a high quality ONO structure. This is because proper functionality of the two-bit EEPROM device requires localized charge storage within the ONO structure. In particular, the top oxide layer must have a density sufficient to minimize the formation of charge traps. The formation of charge traps in the top oxide layer can lead to undesirable charge leakage within the top oxide layer and at the interface between the top oxide layer and the underlying silicon nitride layer. In a properly formed ONO structure, all electrical charge is stored in the silicon nitride layer. By fabricating a high quality top oxide layer, stored charge in the ONO structure remains localized within predetermined regions in the silicon nitride layer.

In one form, a process for fabricating an ONO floating-gate electrode includes providing a semiconductor substrate, and thermally growing a first silicon oxide layer on the semiconductor substrate. Then, a silicon nitride layer is formed to overlie the first silicon oxide layer. A second layer of silicon oxide is then formed to overlie the silicon nitride layer using an oxidation process. After forming the second silicon oxide layer, a nitridation process is carried out to transform second silicon oxide layer into a nitrogenated silicon oxide layer. The nitridation process is preferably carried out by annealing semiconductor substrate 16 in a nitrogen-containing gas atmosphere.

Figure 1:
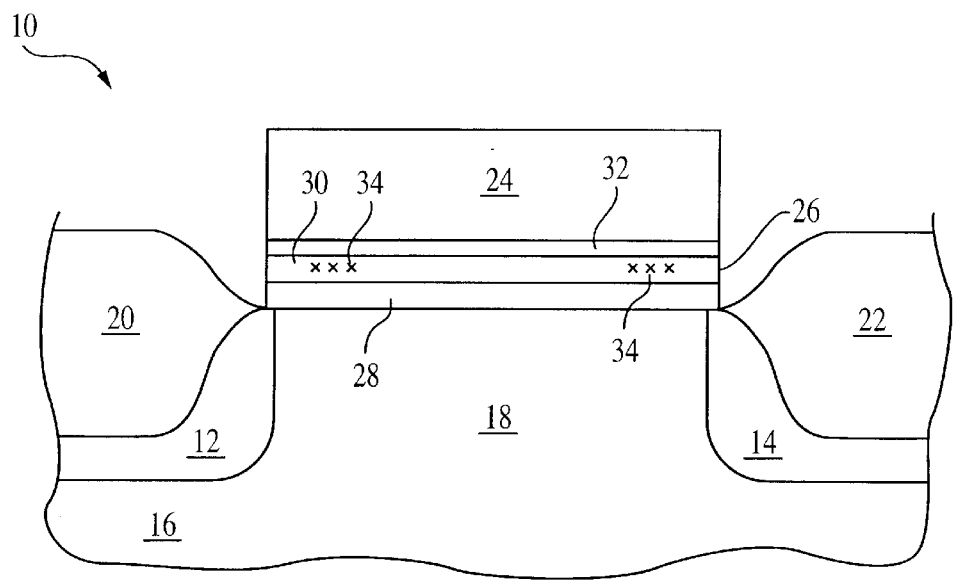
FIG. 1 illustrates, in cross-section, a portion of a semiconductor substrate containing a floating-gate transistor that incorporates an ONO structure fabricated in accordance with the invention.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION OF PREFERRED EMBODIMENTS

Shown in FIG. 1, in cross-section, is a floating-gate transistor 10 suitable for use in a two-bit EEPROM device. Floating-gate transistor 10 includes source/drain regions 12 and 14 located in a semiconductor substrate 16 and separated by a channel region 18. First and second bit line oxide regions 20 and 22 overlie source/drain regions 12 and 14, respectively. A control gate electrode 24 overlies channel region 18 and is separated therefrom by an ONO structure 26. Control gate electrode 24 and ONO structure 26 form a stacked-gate structure.

ONO structure 26 includes a first silicon oxide layer 28 overlying channel region 18. A silicon nitride layer 30 overlies first silicon oxide layer 28. A second silicon oxide layer (or top oxide layer) 32 overlies silicon nitride layer 30.

In the operation of floating-gate transistor 10, voltages are applied to control-gate electrode 24 and to source/drain regions 12 and 14 that cause electrical charge from source/drain regions 12 and 14 to propagate across channel region 18. Once the charge encounters a sufficiently strong vertical field, the charge is either injected or tunnels from channel region 18 into silicon nitride layer 30. For example, depending upon the particular voltage levels applied to control-gate electrode 24 and to source/drain regions 12 and 14, electrical charge 34 is transferred into silicon nitride layer 30 and is localized to regions in proximity to either source/drain region 12, or source/drain region 14.

Those skilled in the art will recognize that the proper functioning of a two-bit EEPROM device necessarily requires that electrical charge 34 remain isolated in the regions of silicon nitride layer 30 to which it is initially introduced. The proper maintenance of electrical charge 34 in localized regions of silicon nitride layer 30 is critical to the proper performance of a two-bit EEPROM device. In particular, the quality of ONO structure 26 must be such that charge leakage paths are minimized at the interface between the first and second silicon oxide layers 28 and 32, and silicon nitride layer. Additionally, second silicon oxide layer 32 must be of sufficient density, such that charge trapping sites are minimized within the silicon oxide material.

In accordance with the invention, charge leakage within ONO structure 26 is minimized by forming a high-quality nitrogenated top oxide layer. The reduced charge leakage and improved floating-gate transistor performance obtained by the present invention can be better understood following a description of an ONO fabrication process carried out in accordance with the invention.

Figure 2:
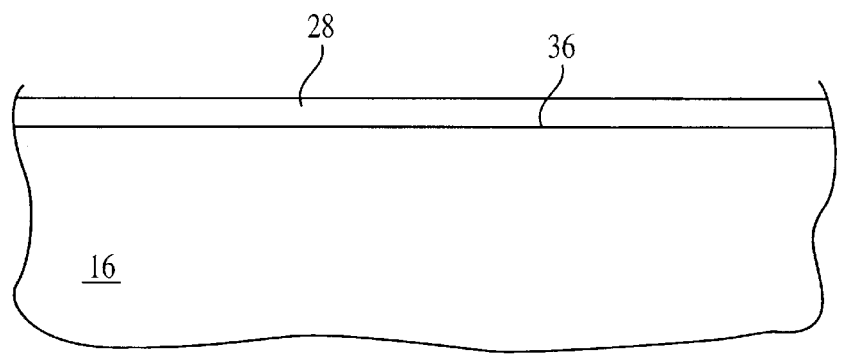
FIGS. 2–4 illustrate, in cross-section, process steps for the fabrication of an ONO structure in accordance with the invention.

Referring to FIG. 2, first silicon dioxide layer 28 is formed to overlie the surface of semiconductor substrate 16. Preferably, semiconductor substrate 16 is a single crystal silicon substrate. Semiconductor substrate 16 has an upper surface 36 previously processed to remove debris and native oxides. Preferably, first silicon oxide layer 28 is formed by thermally oxidizing surface 36 at an elevated temperature in the presence of dry molecular oxygen. Preferably, the oxidation process is carried out at a temperature of about 900 to about 1100° C. The oxidation process forms a silicon oxide layer preferably having a thickness of about 50 to about 150 angstroms, and more preferably a thickness of about 100 angstroms. The oxidation process can be carried out in either a batch-type thermal oxidation furnace, or alternatively, in a single-wafer oxidation apparatus.

Figure 3:
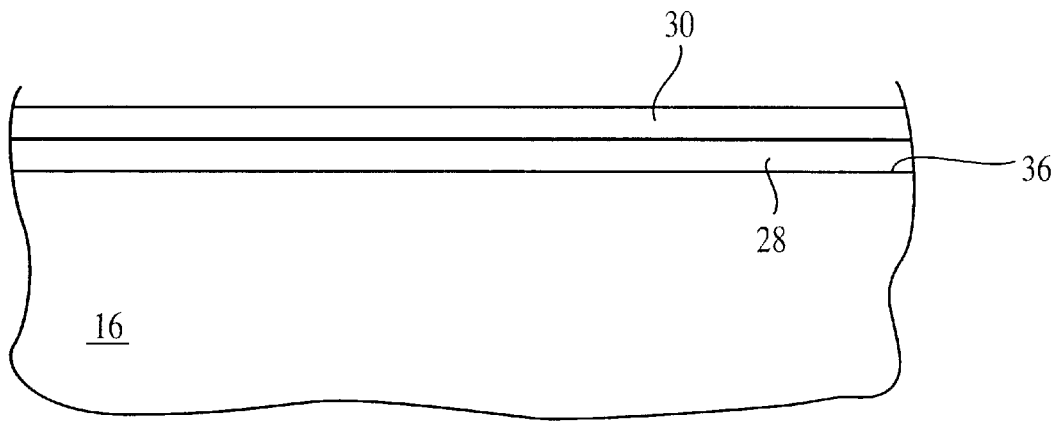

After forming first silicon oxide layer 28, silicon nitride layer 30 is formed to overlie first silicon oxide layer 28, as illustrated in FIG. 3.

Preferably, silicon nitride layer 30 is formed by means of a rapid-thermal-chemical-vapor-deposition (RTCVD) process. The RTCVD process is carried out at a temperature of about 700 to about 800° C. The silicon nitride material is formed by reacting ammonia ($NH_3$) with either dichlorosilane ($SiCl_2H_2$) or silane ($SiH_4$). The processes is carried out for a period of time and at gas flow rates sufficient to form a silicon nitride layer preferably having a thickness of about 50 to about 150 angstroms, and more preferably about 100 angstroms. In one embodiment of the invention, ammonia is introduced in the RTCVD apparatus at a flow rate of about 1 standard liter per minute (slpm) and either dichlorosilane or silane is introduced at a flow rate of about 30 to about 50 standard-cubic-centimeters-per-minute (sccm). The RTCVD process is carried out in three steps including an initial temperature ramp, a deposition step, and cool-down step. Preferably, the total residence time of substrate 16 in the RTCVD apparatus is about 3 minutes. Preferably, the silicon nitride deposition step is completed in about 2 minutes.

Alternatively, silicon nitride layer 30 can be formed by means of a low-pressure-chemical-vapor-deposition (LPCVD) process. In the alternative method, the silicon nitride can be formed in a batch deposition apparatus. The LPCVD process is preferably carried out at a pressure of about 200 to about 500 millitor (mtorr), at temperatures 700–800° C. using ammonia and either dichlorosilane or silane gas.

Figure 4:
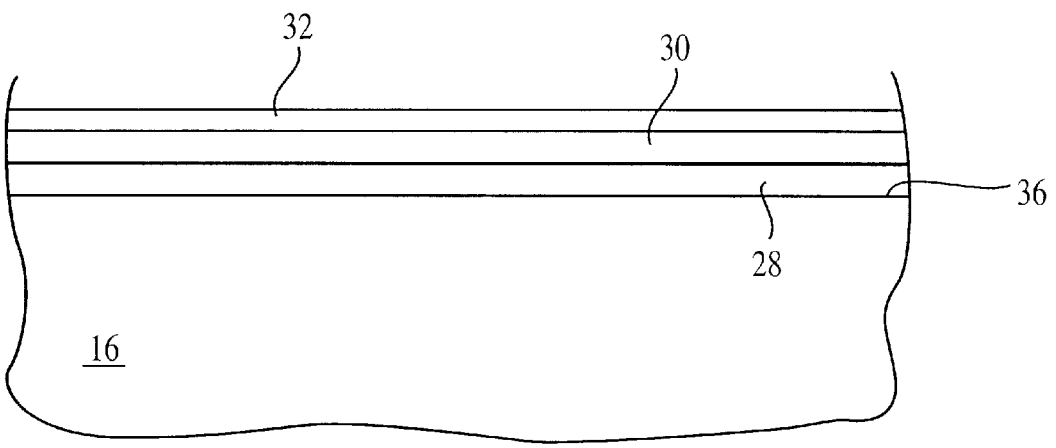

After forming silicon nitride layer 30, second silicon oxide layer 32 is formed to overlie silicon nitride layer 30, as illustrated in FIG. 4. In accordance with the invention, second silicon oxide layer 32 is formed by either an RTCVD or an LPCVD process. The second silicon oxide layer 32 is formed in an RTCVD apparatus using nitrous oxide ($N_2O$) and dichlorosilane. The RTCVD processes preferably carried out at a temperature of about 700 to about 800° C. and for a total processing time of about 3 minutes. In similarity with the RTCVD process used to deposit silicon nitride layer 30, a three-step deposition sequence is used including a ramp up step, a deposition step, and a cool down step. The total processing time in the RTCVD apparatus is about 3 minutes. Preferably, during the deposition step about 1 to about 3 slpm, and more preferably, about 2 slpm of nitrous oxide is used. Additionally, about 25 to about 75 sccm, and more preferably, about 50 sccm of dichlorosilane is used. The RTCVD process forms a silicon oxide layer having a preferred thickness of about 50 to about 150 angstroms, and more preferably about 100 angstroms. In the LPCVD process, the second oxide is deposited on nitride in a batch type of furnace at temperatures of 700–800° C.

The foregoing RTCVD process for the formation of both the silicon nitride layer and the top oxide layer advantageously provides an in-situ process for the sequential formation of individual layers within the ONO structure. In particular, the formation of silicon nitride layer 30 and second silicon oxide layer 32 in a sequential, in-situ deposition sequence, minimizes contamination at the silicon nitride/silicon oxide interface. Additionally, uncontrolled native oxidation can be reduced to insure that a single, high-density silicon oxide layer is deposited over silicon nitride layer 30.

An important aspect of the invention includes the sequential formation of silicon nitride layer 30 and second silicon oxide layer 32 in the absence of exposure of silicon nitride layer 30 to ambient atmosphere. Following the deposition of silicon nitride layer 30 onto first silicon oxide layer 28, substrate 16 is transferred to an oxide deposition chamber under vacuum conditions without exposing the substrate to ambient atmosphere. Alternatively, a positive-pressure inert gas atmosphere can be introduced during wafer transfer. The in-situ nitride and oxide deposition response can be carried out in a batch-type LPCVD system.

Those skilled in the art will appreciate that various means exist for insuring that silicon nitride layer 30 is not exposed to ambient atmosphere prior to the deposition of second silicon oxide layer 32. For example, a cluster/tool apparatus can be used in which semiconductor substrate 16 is transferred from a nitride deposition chamber to an oxide deposition chamber in a continuous vacuum environment, or in a positive pressure inert gas atmosphere. Alternatively, the nitride deposition and oxide deposition processes can be sequentially carried out in a single deposition chamber that is configured to receive various processing gases. Accordingly, all such variations and modifications are contemplated in the present invention.

After forming the second silicon oxide layer, a nitridation process is carried out to transform second silicon oxide layer into a nitrogenated silicon oxide layer. The nitridation process is preferably carried out by annealing semiconductor substrate 16 in a nitrogen-containing gas atmosphere. In one embodiment, gases such as ammonia, nitrogen oxide (NO), and nitrous oxide can be introduced into a batch-type thermal annealing furnace. An annealing process is then carried out at a temperature of preferably about 800° C. to about 1100° C. The annealing process transforms second silicon oxide layer 32 into a nitrogenated silicon oxide layer having a nitrogen concentration of about 0 wt. % to about 10 wt. %.

In an alternative embodiment, the nitrogenation process is carried out in an RTCVD apparatus. The same nitrogen-containing gases can be used in both the RTCVD process and the batch type furnace annealing process.

Following the formation of ONO structure 26, the stacked-gate structure shown in FIG. 1 is completed by depositing a layer of gate forming material overlying second silicon oxide layer 32. A lithographic patterning and etching process is then carried out to define control-gate electrode 34 and an ONO floating-gate electrode. Those skilled in the art will recognize that various gate-forming materials can be used to fabricate control-gate electrode 24. For example, control-gate electrode 24 can be formed with polycrystalline silicon, amphorous silicon, a refractory metal silicide, and the like.

Thus, there has been disclosed in accordance with the invention a nitridation process for fabricating an ONO floating-gate electrode in a two-bit EEPROM device that fully provides the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the thicknesses of the individual layers making up the ONO structure can be varied from that described herein. It is therefore intended to include within the invention all such variations and modifications that fall within the scope of the appended claims and equivalents thereof.

What is claimed is:

1. A process for fabricating an ONO floating-gate electrode in a two-bit EEPROM device comprising the steps of:
   providing a semiconductor substrate;
   forming a first silicon oxide layer overlying the semiconductor substrate;
   forming a silicon nitride layer overlying the first silicon oxide layer;
   forming a second silicon oxide layer overlying the silicon nitride layer by a first rapid thermal chemical vapor deposition process at a temperature from about 700° C. to about 800° C. using nitrous oxide and dichlorosilane; and
   subjecting the second silicon oxide layer to a second rapid thermal chemical vapor deposition process with exposure to a nitrogen-containing gas to form a nitridated silicon oxide layer, and to form said ONO floating-gate electrode.

2. The process of claim 1, wherein subjecting the second silicon oxide layer to a second rapid thermal chemical vapor deposition process in a nitrogen-containing gas is carried out at a temperature from about 800° C. to about 1100° C.

3. The process of claim 1, wherein the nitrogen-containing gas is selected from the group consisting of ammonia, nitrogen oxide, and nitrous oxide.

4. The process of claim 1, further comprising:
   prior to forming the second silicon oxide layer, transferring the semiconductor structure to an oxide deposition chamber under vacuum conditions to mitigate exposing the silicon nitride layer to ambient air.

5. The process of claim 1, wherein nitridating the second silicon oxide layer comprises flowing the nitrogen-containing gas into a rapid thermal chemical vapor deposition process apparatus.

6. The process of claim 1, wherein the step of forming a nitrogenated silicon oxide layer comprises forming a nitrogenated silicon oxide layer having a nitrogen concentration of about 0 wt. % to about 10 wt. %.

7. A process for fabricating a stacked-gate structure including an ONO floating-gate electrode in a two-bit EEPROM device comprising:
   providing a semiconductor substrate having a first bit-line oxide layer and a second bit-line oxide layer therein separated by a substrate surface region;
   forming the ONO floating-gate electrode on the substrate surface region comprising:
     sequentially forming a first silicon oxide layer on the substrate surface region, a silicon nitride layer overlying the first silicon oxide layer, and a second silicon oxide layer overlying the silicon nitride layer; and
     subjecting the second silicon oxide layer to a rapid thermal chemical vapor deposition process in a nitrogen-containing gas to form a nitridated silicon oxide layer, and to form said ONO floating-gate electrodes; and
   depositing a control gate electrode layer overlying the ONO floating gate electrode to form a stacked-gate structure on the substrate surface region.

8. The process of claim 7, wherein subjecting the second silicon oxide layer to a rapid thermal chemical vapor deposition process in a nitrogen-containing gas is carried out at a temperature of about 700° C. to about 1000° C.

9. The process of claim 7, wherein the nitrogen-containing gas is selected from the group consisting of ammonia, nitrogen oxide, and nitrous oxide.

10. The process of claim 7, further comprising:
    prior to forming the second silicon oxide layer, transferring the semiconductor structure to an oxide deposition chamber under vacuum conditions to mitigate exposing the silicon nitride layer to ambient air.

11. The process of claim 7, wherein nitridating the second silicon oxide layer comprises flowing the nitrogen-containing gas into a rapid thermal chemical vapor deposition process apparatus.

12. The process of claim 2, wherein the step of forming a nitrogenated silicon oxide layer comprises forming a nitrogenated silicon oxide layer having a nitrogen concentration of about 0 wt. % to about 10 wt. %.

13. A process for fabricating an ONO floating-gate electrode in a two-bit device comprising the steps of:
    providing a semiconductor substrate having a silicon surface region;
    depositing a bottom silicon oxide layer overlying the surface region;
    depositing a silicon nitride layer overlying the bottom silicon oxide layer;
    depositing a top silicon oxide layer overlying the silicon nitride layer by a first rapid thermal chemical vapor deposition process at a temperature from about 700° C. to about 800° C. using nitrous oxide and dichlorosilane; and
    subjecting the top silicon layer to a second rapid thermal chemical vapor deposition process in a nitrogen-containing gas ambient selected from the group consisting of ammonia, nitrogen oxide, and nitrous oxide to form a nitridated silicon oxide layer having a nitrogen concentration from about 0 wt. % to about 10 wt. % to form said ONO floating-gate electrode,
    wherein the second rapid thermal chemical vapor deposition process is carried out at a temperature from about 700° C. to about 1000° C.

14. The process of claim 13, further comprising:
    prior to depositing the top silicon oxide layer, transferring the semiconductor structure to an oxide deposition chamber under vacuum conditions to mitigate exposing the silicon nitride layer to ambient air.

* * * * *